United States Patent [19]
Mira

[11] Patent Number: 5,661,638
[45] Date of Patent: Aug. 26, 1997

[54] HIGH PERFORMANCE SPIRAL HEAT SINK

[75] Inventor: Ali Mira, San Jose, Calif.

[73] Assignee: Silicon Graphics, Inc., Mountain View, Calif.

[21] Appl. No.: 552,801

[22] Filed: Nov. 3, 1995

[51] Int. Cl.$^6$ .................................................. H05K 7/20
[52] U.S. Cl. ........................ 361/697; 165/80.3; 165/126
[58] Field of Search ...................... 165/80.2, 80.3, 165/122, 124, 126, 185; 174/16.3; 257/706, 707, 713, 718, 719, 727; 361/687, 690, 694–697, 704, 707, 717–719, 724; 415/176, 178, 213.1, 214.1, 220

[56] References Cited

U.S. PATENT DOCUMENTS

| | | | |
|---|---|---|---|
| 3,592,260 | 7/1971 | Berger | 165/185 |
| 4,838,041 | 6/1989 | Bellows et al. | 165/80.2 |
| 5,132,780 | 7/1992 | Higgins, III | 361/694 |
| 5,409,352 | 4/1995 | Lin | 361/697 |

*Primary Examiner*—Gregory D. Thompson
*Attorney, Agent, or Firm*—Wagner, Murabito & Hao

[57] ABSTRACT

A thermally conductive heat sink unit. In the present invention, a thermally conductive heat sink has a first surface. A plurality of arc-shaped cooling fins are formed in the first surface. The arc-shaped cooling fins extend radially outward from a central region of the first surface. A second surface of the thermally conductive heat sink is adapted to thermally contact a heat generating device. By contacting the heat generating device, heat generated by the device is dissipated through the arc-shaped cooling fins of the first surface. In one embodiment of the present invention, a recessed region is formed into the first surface of the thermally conductive heat sink. The recessed region is formed above the central region and the region peripherally surrounding the central region such that the recessed region extends into a portion of the arc-shaped cooling fins. In such an embodiment, a fan is embedded within the recessed region of the thermally conductive heat sink. The fan impinges the arc-shaped cooling fins and the central region with a stream of coolant to aid in the dissipation of heat from the thermally conductive heat sink. In one embodiment, the arc-shaped cooling fins are arranged to insure optimal heat transfer via the stream of coolant impinging and flowing by the arc-shaped cooling fins.

9 Claims, 5 Drawing Sheets

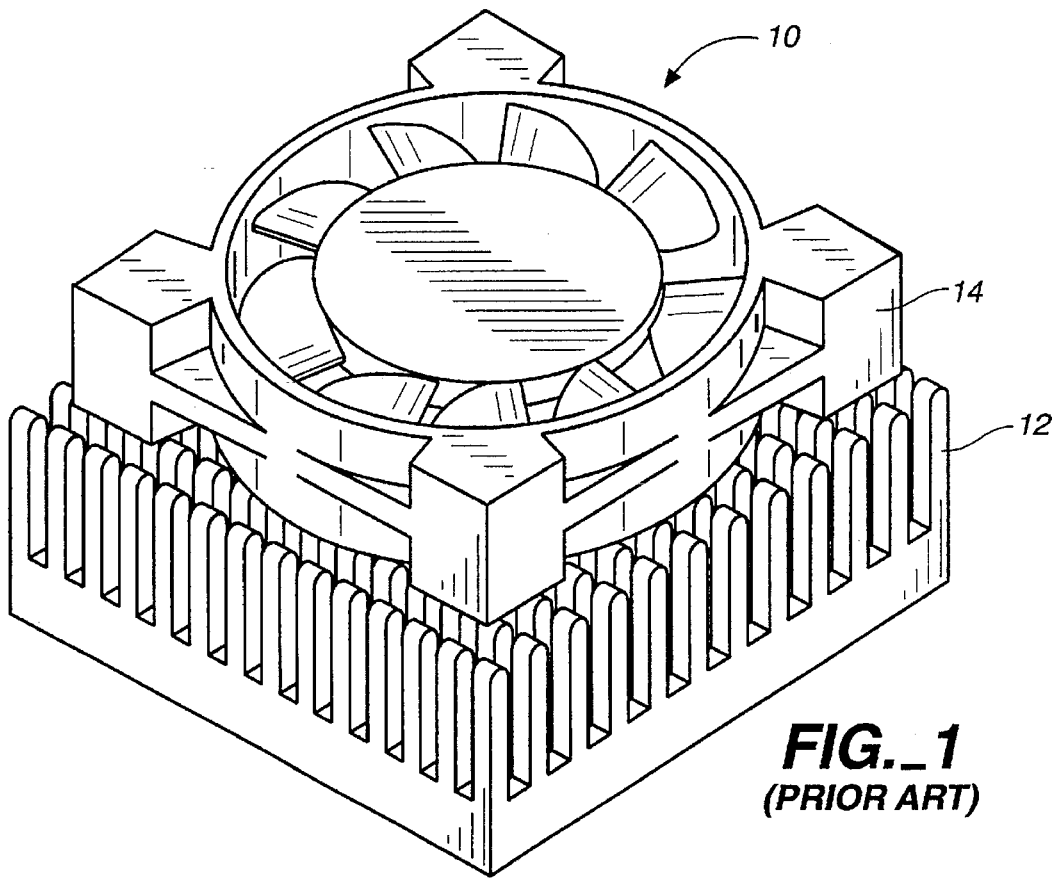
FIG._1
(PRIOR ART)
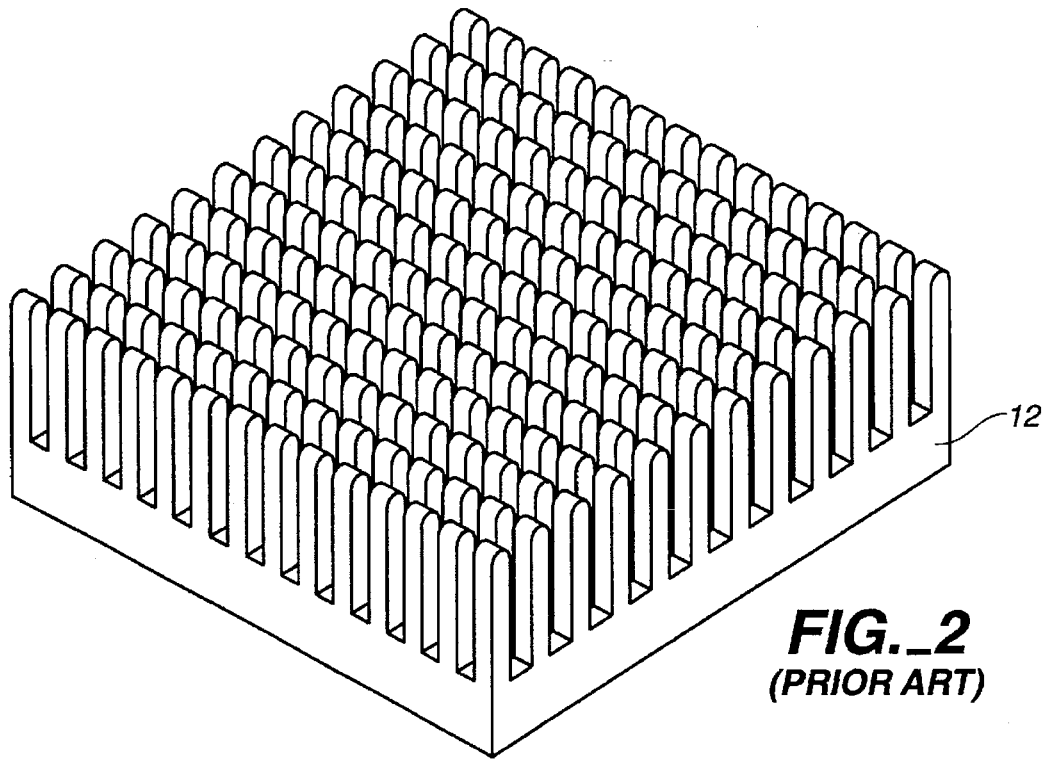
FIG._2
(PRIOR ART)

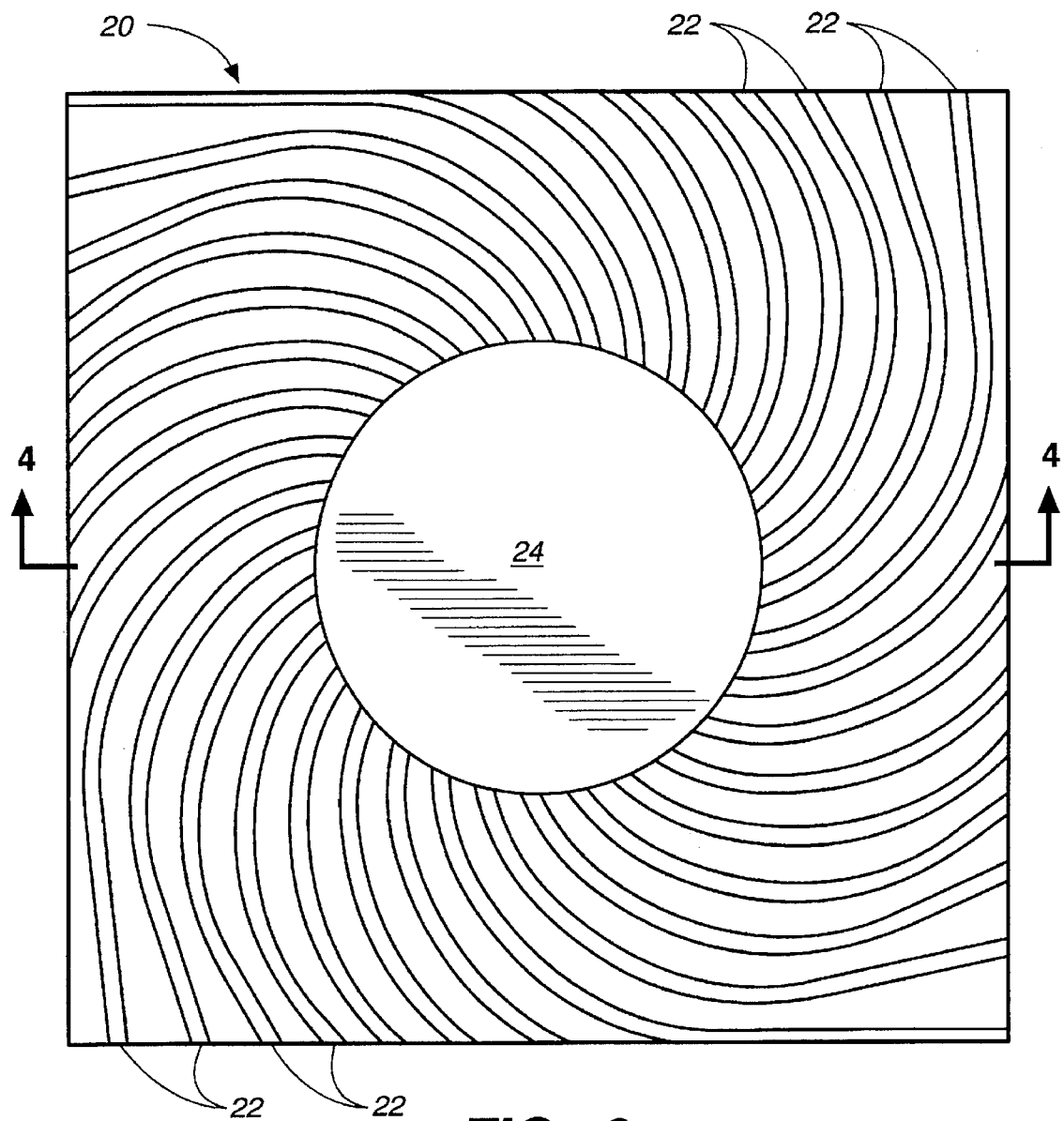
FIG._3
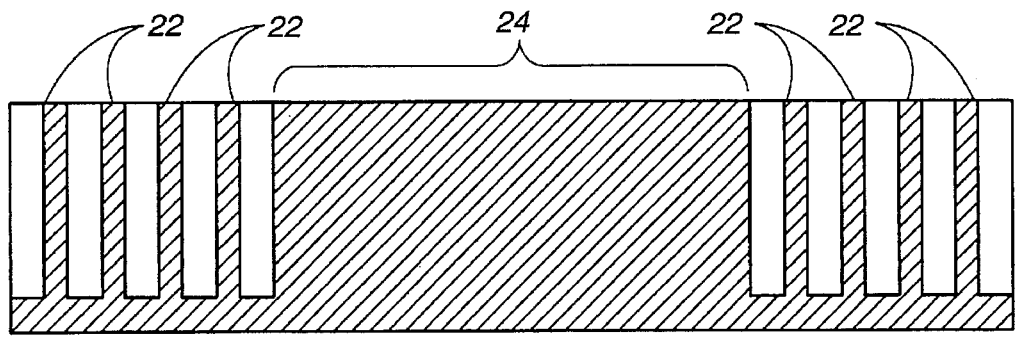
FIG._4

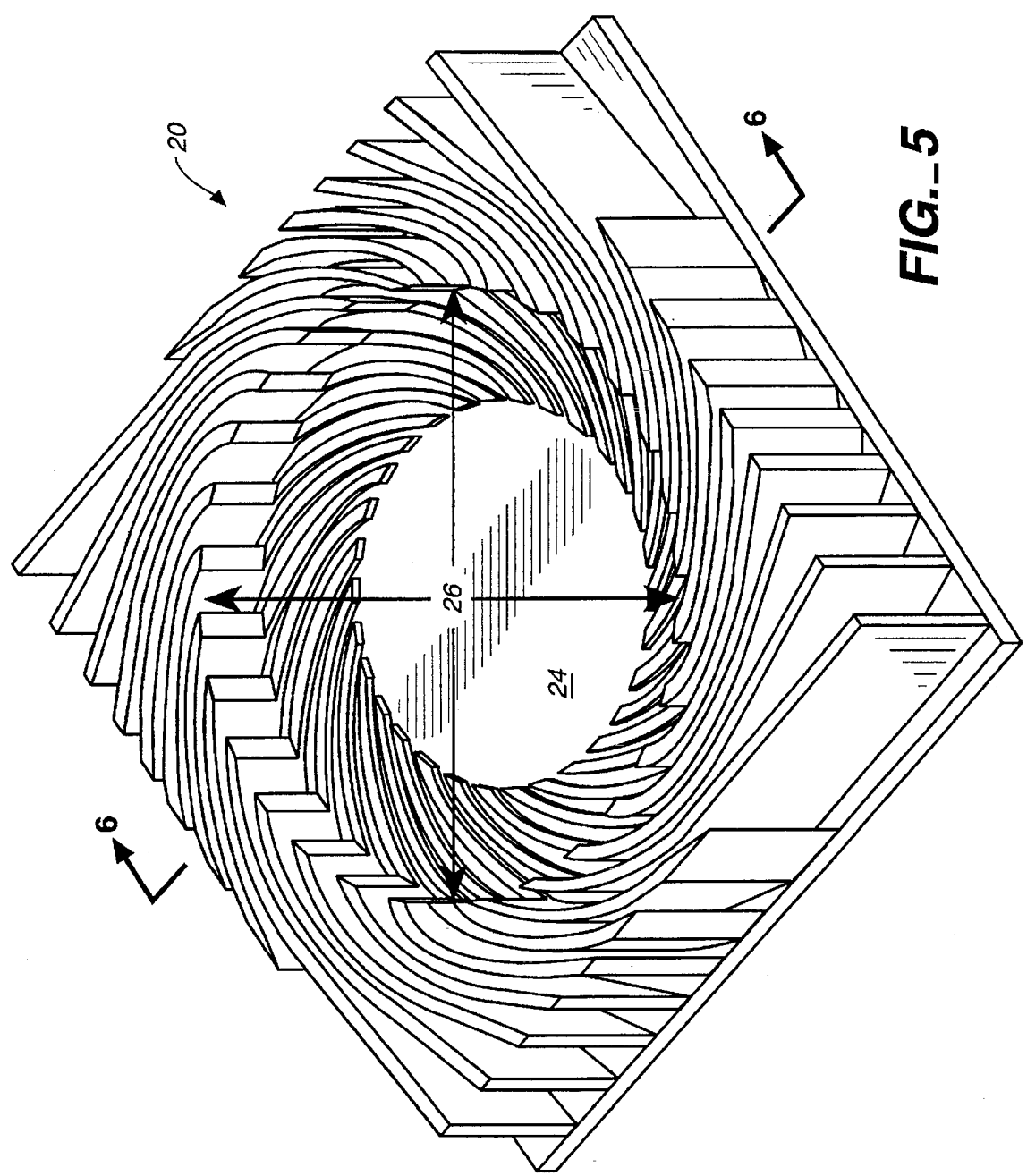
FIG._5

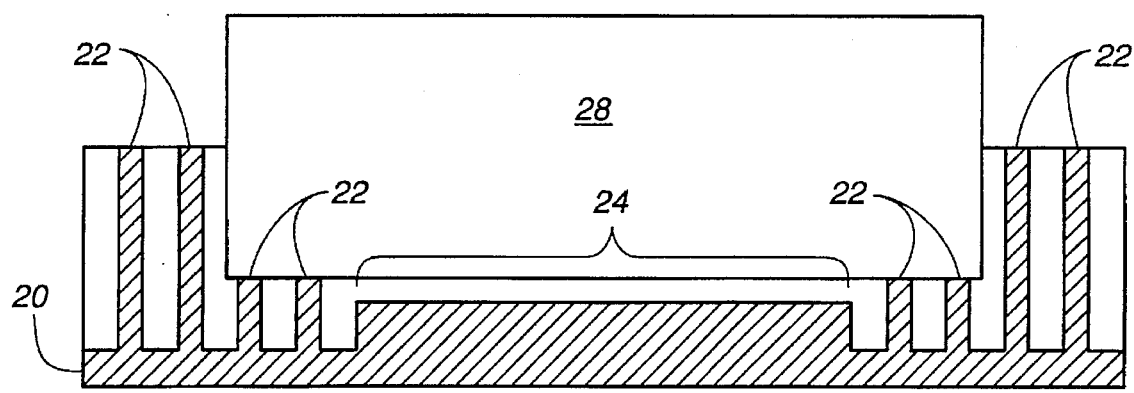
FIG._6

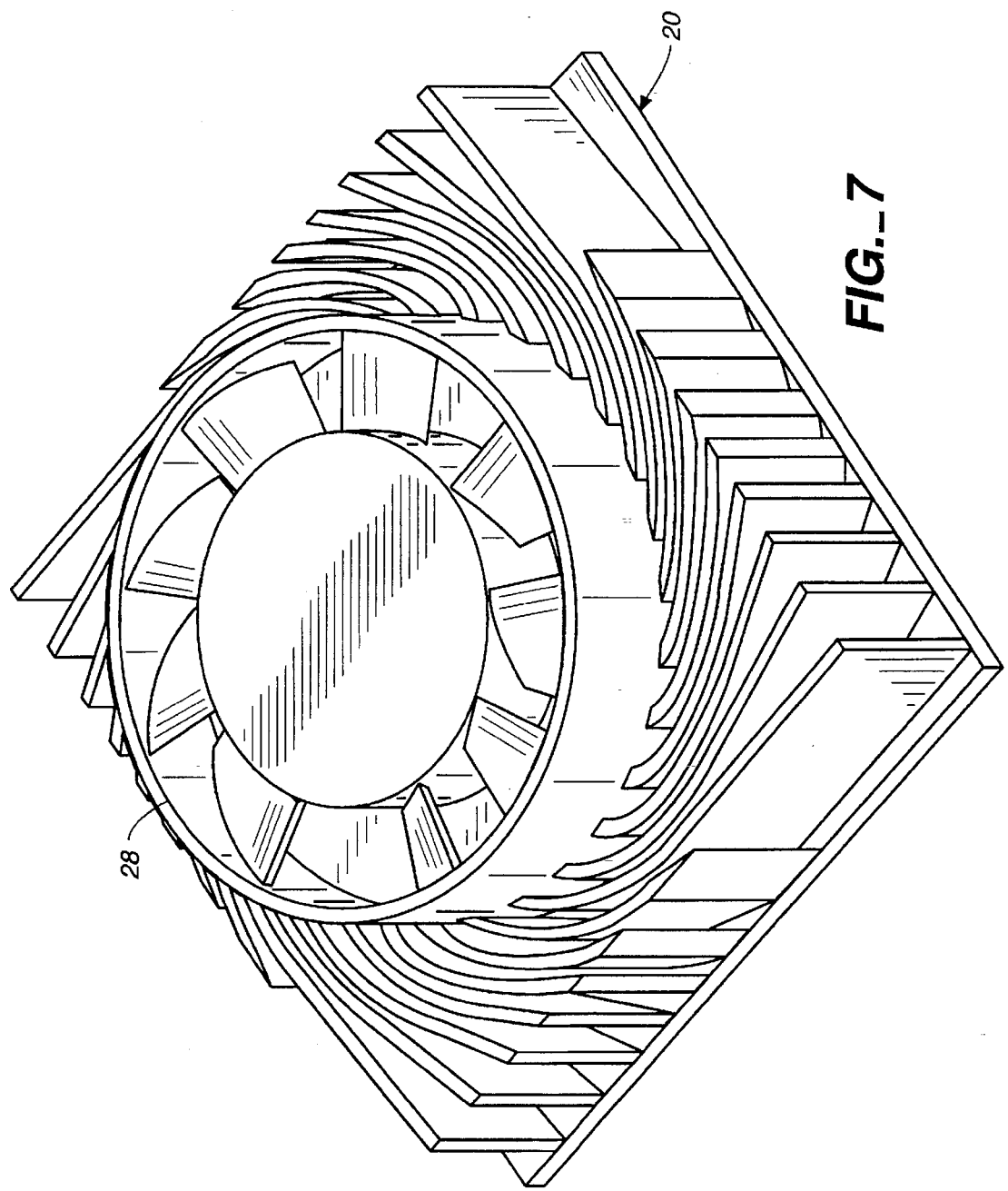
FIG._7

HIGH PERFORMANCE SPIRAL HEAT SINK

TECHNICAL FIELD

This invention relates to heat removal devices. Specifically, the present invention relates to a heat sink used to remove excess heat from an integrated circuit chip.

BACKGROUND ART

It is well known that integrated circuit chips are becoming increasingly complex with correspondingly crowded circuit architectures. However, such crowded architectures often result in an unwanted increase in heat generation. For example, some integrated circuit chips currently generate as much as 40–50 watts of power on a 1-inch by 1-inch surface. The excess heat generated by such chips will destroy or burn-up the chip if not removed. That is, if heat is generated by the chip at a rate of 40–50 Joules per second (40–50 watts), the heat must be dissipated at some rate which enables the chip to remain functional.

The removal of heat from high heat generating integrated circuit chips has be attempted using extremely large heat sinks. However, such prior art heat sinks are typically bulky, unwieldy, and consume valuable printed circuit board real estate. In another attempt to remove excess heat, water or liquid-cooled heat sinks have been employed. Again, such prior art heat sinks are bulky, unwieldy, and consume valuable printed circuit board real estate. Furthermore, liquid cooled heat sink are often prohibitively expensive, extremely complex, and difficult to mass, produce due to reliability problems.

One technique attempted to achieve sufficient heat transfer or dissipation is referred to as impingement cooling. In impingement cooling, a fan is attached to the heat sink. The fan blows or "impinges" air against or over the heat sink attached to an integrated circuit chip. While impingement cooling increases the effectiveness of the heat sink, impingement cooling also has significant drawbacks associated therewith.

With reference now to Prior Art FIG. 1, a prior art heat sink assembly 10 adapted for impingement cooling is shown. Specifically, as shown in Prior Art FIG. 1, heat sink assembly 10 includes a heat sink 12 having a fan 14 attached thereto. The fan heat sink of Prior Art FIG. 1 is for example, a Thermalloy model TCM425 fan heat sink manufactured by the Thermalloy company of Dallas, Tex. The addition of fan 14 significantly increases the cost of heat sink assembly 10. As a further drawback, the addition of fan 14 substantially increases the size and bulkiness of heat sink assembly 10. Furthermore, fan heat sinks are undesirably "tall" or have an especially large "profile." That is, such fan heat sinks extend outward a great distance from the surface of the printed circuit board on which the integrated circuit chip is attached. Thus, a printed circuit board having a fan heat sink attached thereto can only be used in an environment adapted to accommodate the especially large profile of the fan heat sink.

The effectiveness of impingement cooling systems depends on numerous factors. These factors include, for example, the surface area of the heat sink, and the velocity with which air flows through the surface of the heat sink. Unfortunately, in the prior art, heat sinks having a large surface area tend to limit the velocity with which air flows through the heat sink surface. Therefore, in the prior art, increased heat sink surface area is associated with a unwanted decrease in air flow velocity through the surface of the heat sink.

Prior Art FIG. 2 shows heat sink assembly 10 of Prior Art FIG. 1 with fan 14 removed therefrom in order to clearly show the structure of the surface of heat sink 12. As shown in Prior Art FIG. 2, heat Sink 12 is comprised a plurality of pin-shaped fins extending from the surface thereof. Although the pin-shaped fins of heat sink 12 provide significant surface area, the pin-shaped fins significantly restrict and slow the flow of coolant air across the surface of heat sink 12. Thus, in the prior art, coolant air speed has been sacrificed in order to achieve a large surface area. In other instances, the surface area of prior art heat sinks has been sacrificed in order achieve greater air speed.

Thus, a need exists for a heat sink unit or assembly which provides sufficient heat dissipation to effectively cool high heat generating integrated circuit chips. A further need exists for a heat sink unit or assembly which provides substantial surface area without substantially slowing or restricting the flow of coolant air across the surface of the heat sink unit or assembly. It is, therefore, an object of the present invention to provide a heat sink unit or assembly which provides sufficient heat dissipation to effectively cool high heat generating integrated circuit chips. It is a further object of the present invention to provide a heat sink unit or assembly which provides substantial surface area without substantially slowing or restricting the flow of coolant air across the surface of the heat sink unit or assembly.

DISCLOSURE OF THE INVENTION

A thermally conductive heat sink unit is disclosed. In the present invention, a thermally conductive heat sink has a first surface. A plurality of arc-shaped cooling fins are formed in the first surface. The arc-shaped cooling fins extend radially outward from a central region of the first surface. A second surface of the thermally conductive heat sink is adapted to thermally contact a heat generating device. By contacting the heat generating device, heat generated by the device is dissipated through the arc-shaped cooling fins of the first surface.

Specifically, in one embodiment of the present invention, a recessed region is formed into the first surface of the thermally conductive heat sink. The recessed region is formed above the central region and the region peripherally surrounding the central region such that the recessed region extends into a portion of the arc-shaped cooling fins. In such an embodiment, a fan is embedded within the recessed region of the thermally conductive heat sink. The fan impinges the arc-shaped cooling fins and the central region with a stream of coolant to aid in the dissipation of heat from the thermally conductive heat sink. In another embodiment of the present invention, the arc-shaped cooling fins are arranged to insure optimal heat transfer via the stream of coolant impinging and flowing by the arc-shaped cooling fins.

BRIEF DESCRIPTION OF THE DRAWINGS

The accompanying drawings, which are incorporated in and fore a part of this specification, illustrate embodiments of the invention and, together with the description, serve to explain the principles of the invention:

FIG. 1 is a perspective view of a prior art heat sink assembly adapted for impingement cooling.

FIG. 2 is a perspective view of the prior art heat sink assembly of FIG. 1, with a fan removed therefrom.

FIG. 3 is a top plan view of a heat sink in accordance with the present claimed invention.

FIG. 4 is a side sectional view of the heat sink of FIG. 3 taken along section line 4—4 of FIG. 3 in accordance with the present claimed invention.

FIG. 5 is a perspective view of another embodiment of the present invention in which the top surface of the present heat sink has a recessed region formed therein in accordance with the present claimed invention.

FIG. 6 is a side sectional view of the embodiment of FIG. 5 taken along line 6—6 and including a fan disposed within the recessed region in accordance with the present claimed invention.

FIG. 7 is a perspective view of the embodiment of FIG. 6 wherein a fan is disposed in a recessed region within the heat sink in accordance with the present claimed invention.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

With reference now to FIG. 3, a top plan view of a heat sink 20 in accordance with the present invention is shown. In the present invention, heat sink 20 has a plurality of arc-shaped cooling fins, typically shown as 22, formed on the top surface thereof. Heat sink 20 is adapted to have the bottom surface thereof placed in thermal contact with a heat generating integrated circuit chip, not shown. For example, the bottom surface of heat sink 20 includes an indentation allowing heat sink 20 to fit over the heat generating integrated circuit chip. In such an embodiment, a thermally conductive layer of bonding material thermally couples the top surface of the heat generating integrated circuit chip to the bottom surface of heat sink 20. Although, heat sink 20 and the heat generating integrated circuit chip are thermally coupled as described above in the present embodiment, the present invention is also well suited to various other approaches for coupling heat sink 20 to a heat generating integrated circuit chip.

With reference still to FIG. 3, in the present embodiment, arc-shaped cooling fins 22 extend radially outward from a central region 24. The numerous arc-shaped cooling fins 22 provide significant surface area and dissipate heat from heat sink 20, thereby cooling the heat generating chip. More specifically, in the present embodiment, a coolant such as, for example, air passing through arc-shaped cooling fins 22 dissipates heat from heat sink 20 to the ambient. As shown in FIG. 3, arc-shaped fins 22 are arranged is a spiral configuration. The spiral configuration of arc-shaped fins 22 facilitates an efficient radially outward flow of a coolant from central region 24. That is, spirally configured arc-shaped cooling fins 22 reduce coolant flow obstruction associated with prior art heat sinks. Therefore, when coolant is directed onto the present heat sink 20, the coolant will flow radially outward from central region 24 at a velocity which is greater than available in prior art heat sinks. As mentioned above, cooling effectiveness depends upon such factors the surface area of the heat sink, and the velocity with which coolant flows through the surface of the heat sink. Hence, the large surface area and increased coolant flow velocity in present heat sink 20 improves cooling effectiveness over prior art heat sinks.

With reference next to FIG. 4, a side sectional view taken along section line 4—4 of FIG. 3 is shown. Central region 24 is, for example, a solid elliptical core extending vertically from the center of heat sink 20. Central region 24 is disposed on the top surface of heat sink 20 over the location where the heat generating integrated circuit chip thermally contacts the bottom surface of heat sink 20. That is, central region 24 is located at the hottest portion of heat sink 20. Thus, the solid core comprising central region 24 readily absorbs heat from the heat generating integrated chip. In so doing, the present invention facilitates efficient and expedient dissipation of excess heat from the heat generating integrated circuit chip. Although central region 24 is located above where the heat generating integrated circuit chip thermally contacts the bottom surface of heat sink 20, the present invention is also well suited to having central region 24 located elsewhere on the top surface of heat sink 20. Furthermore, although central region 24 is elliptically shaped in the present embodiment, the present invention is also well suited to having central region 24 shaped other than elliptically.

Referring now to FIG. 5, a perspective view of another embodiment of the present invention is shown in which the top surface of heat sink 20 has a recessed region 26 formed therein. As shown in FIG. 5, in the present embodiment, a circular recessed region 26 is formed into the portion of the top surface of heat sink 20 including central region 24 and the region peripherally surrounding central region 24. Although recessed region 26 is formed into the portion of the top surface of heat sink 20 including central region 24 and the region peripherally surrounding central region 24, the present invention is also well suited to having recessed region 26 formed elsewhere into the top surface of heat sink 20. Furthermore, although recessed region 26 is circularly shaped in the present embodiment, the present invention is also well suited to having recessed region 26 shaped other than circularly. For example, the present invention is well suited to having recessed region 26 shaped to accommodate various fan shapes.

With reference now to FIG. 6, a side sectional view of the embodiment of FIG. 5 taken along line 6—6 is shown wherein a fan 28 is disposed within recessed region 26. The present invention provides several advantages over prior art heat sinks. For example, as coolant such as air is directed by fan 28 onto the surface of heat sink 20, the air immediately impinges central region 24. As stated above, central region 24 is the hottest portion of heat sink 20. Therefore, the incoming coolant air immediately impinges and cools the hottest portion of heat sink 20. Hence, in the present invention incoming coolant impinges the hottest portion of the heat sink when the coolant is at the lowest temperature. Although air is specified as the coolant in the present embodiment, the present invention is well suited to the use of other coolants such as for example, clean inert gases, liquid coolants, and the like. FIG. 7 shows a perspective view of the present embodiment with fan 28 is disposed in recessed region 26.

With reference again to FIG. 6, the present invention also has substantially improved air flow benefits compared to prior art heat sinks. In the present embodiment, arc-shaped cooling fins 22 are spirally arranged to achieve optimal heat transfer between heat sink 20 and the ambient. Specifically, arc-shaped cooling fins 22 are disposed such that minimal coolant flow obstruction is created by arc-shaped cooling fins 22. That is, arc-shaped cooling fins 22 are aligned with the radially outward flow of coolant. Therefore, when coolant is directed onto the present heat sink 20, the coolant will flow radially outward from central region 24 between arc-shaped cooling fins 22. Arc-shaped fins cooling fins 22 then direct the flow of coolant in a tangential orientation. The tangential orientation corresponds to the direction in which unobstructed coolant would flow when directed from a fan. Thus, arc-shaped cooling fins 22 provide less coolant obstruction than prior art cooling fins. Furthermore, by directing the coolant in a tangential direction, the coolant passes along arc-shaped cooling fins for a greater distance. As a result, the coolant encounters and impinges a greater surface area, thereby increasing the cooling effectiveness. Thus, the coolant flows over and through the surface of heat sink 20 at a velocity which is greater than the velocity available in prior art heat sinks. By increasing the velocity of coolant flow without substantially reducing the surface area of the present heat sink, a significant increase in cooling effectiveness is achieved.

High heat generating chips such as, for example, 40–50 watt chips have several operating parameters associated therewith. These parameters include, for example, a maximum ambient temperature and a maximum junction temperature. The maximum ambient temperature refers to the maximum environment or "room" temperature in which the chip can safely be used. The maximum junction temperature refers to the maximum operational temperature of the chip itself. Furthermore, each chip and each heat sink has a thermal resistance coefficient, $\Theta$, associated therewith. The $\Theta$ value is a measure of the rate or ability to dissipate heat. More specifically, the $\Theta_{sa}$, or the ability of the heat sink to dissipate heat to the ambient is measured as follows:

$$\Theta_{sa} = \text{(temp. of heat sink—temp. of ambient)/watts dissipated by chip} \quad 1)$$

Equation 1 states that the $\Theta_{sa}$ of the heat sink is given by the temperature of the heat sink (at the hottest location) minus the temperature of the ambient is divided by the energy (in watts) of the heat generating integrated circuit chip. The best of the prior art heat sinks typically have a $\Theta_{sa}$ of approximately 0.7°–0.9° C./W. It will be understood that it is desired to have as low of a $\Theta_{sa}$ value as is possible.

A description of an experimental comparison between the $\Theta_{sa}$ of the present invention of FIG. 7 and the $\Theta_{sa}$ of the prior art follows. A prior art Themalloy model TCM425 fan heat sink manufactured by the Themalloy company of Dallas, Tex. was placed on a 50 watt generating source. The present invention was also placed on an identical 50 watt generating source. Both heat sinks were in an identical environment having an ambient temperature of 22° C. During repeated measurements, the temperature of the heat sink of the present invention, at the hottest location thereon, was recorded at 52° C. Likewise, during repeated measurements, the temperature of the prior art heat sink, at the hottest location thereon, was recorded at 58.5° C. Thus, the $\Theta_{sa}$ of the heat sink of the present invention and the $\Theta_{sa}$ of the prior art heat sink are easily calculated.

$$\text{Prior Art heat sin } \Theta_{sa} = (58.5° \text{C.}-22° \text{C.})/50 \text{ watts} \quad 2)$$
$$= (36.5° \text{C.})/50 \text{ watts}$$
$$= 0.73° \text{C./W}$$

$$\text{Present heat sink } \Theta_{sa} = (52.5° \text{C.}-22° \text{C.})/50 \text{ watts} \quad 3)$$
$$= (30.5° \text{C.})/50 \text{ watts}$$
$$= 0.61° \text{C./W}$$

Thus, the present invention achieves a 16% improvement over the best of the prior art heat sinks.

As stated above, conventional 50 watt heat generating integrated circuit chips having numerous operating parameters. That is, conventional 50 watt heat generating integrated circuit chips have a given $\Theta_{jc}$ value. The $\Theta_{jc}$ value is the ability of the chip junction to dissipate heat to the heat sink. For high heat generating integrated circuit chips, the $\Theta_{jc}$ is typically in the range of 0.2°–0.3° C./W. Furthermore, as mentioned above, each 50 watt heat generating integrated circuit chip has a maximum ambient temperature and a maximum junction temperature at which the chip remains functional. A maximum junction temperature is typically 85° C. A maximum ambient temperature is typically 40° C. For a 50 watt heat generating integrated circuit chip, the ($\Theta_{ja}$, the rate of dissipation of heat from the junction to the ambient, can be readily calculated.

$$\Theta_{ja} = (85° \text{C.}-40° \text{C.})/50 \text{ watts} \quad 4)$$
$$= (45° \text{C.})/50 \text{ watts}$$
$$= 0.90° \text{C./W}$$

As shown in equation 4, the $\Theta_{ja}$ value must be equal to or smaller than 0.90° C./W for a 50 watt heat generating integrated circuit chip to remain functional.

Furthermore, it is known that the $\Theta_{ja}$ is given by:

$$\Theta_{ja} = \Theta_{jc} + \Theta_{sa} \quad 5)$$

Given these operating parameters, the $\Theta_{sa}$ required to operate a 50 watt heat generating integrated circuit chip can be calculated. From equation 5 it follows that:

$$\Theta_{sa} = \Theta_{ja} - \Theta_{jc} \quad 6)$$

Given that $\Theta_{jc}$ is typically in the range of 0.25° C./W, and further knowing that $\Theta_{ja}$ must be no greater than 0.90° C./W, it follows from equation 6 that $$\Theta_{sa} = \Theta_{ja} - \Theta_{jc}$$
$$= 0.90° \text{C./W} - 0.25° \text{C./W}$$
$$= 0.65° \text{C./W (maximum value)}$$

Thus, by solving equation 6 using given parameters for a 50 watt heat generating integrated circuit chip, it is determined that the $\Theta_{sa}$ value must be 0.65° C./W or less or the chip will be unable to operate. As shown by equation 2, even the best of the prior art heat sink units are not able to achieve a $\Theta_{sa}$ value of 0.70° C./W or less. Therefore, prior art heat sinks do not dissipate enough heat to allow a 50 watt heat generating integrated circuit chip to remain functional. However, as shown by equation 3, the present invention achieves a $\Theta_{sa}$ value of 0.61° C./W. Therefore, the present invention does effectively dissipate enough heat therefrom to allow a 50 watt heat generating integrated circuit chip to remain functional even at a maximum ambient temperature.

Because prior art heat sinks do not do not dissipate enough heat to allow a 50 watt heat generating integrated circuit chip to remain functional, additional cooling measures must be employed. These cooling measures include, for example, cooling the ambient, liquid cooling the chip, and the like. Such additional cooling measures dramatically increase costs associated with 50 watt heat generating integrated circuit chips. The present invention, on the other hand, effectively cools 50 watt heat generating integrated circuit chips without requiring additional cooling measures, and, therefore, without dramatically increasing the costs associated with such chips.

Referring once again to FIG. 6, as an additional advantage, the present invention does not suffer from the significant size and bulkiness associated with many prior art fan heat sinks. By embedding, fan 28 into recessed region 26, the present invention maintains a low "profile." That is, the present invention does not extend outward a great distance from the surface of a printed circuit board on which a 50 watt heat generating integrated circuit chip is attached. Thus, the present invention is well suited for use in numerous conventional environments and, therefore, is not limited only to use in environments adapted to accommodate the especially large profile of prior art fan heat sinks.

Thus, the present invention provides a heat sink unit or assembly which effectively dissipates sufficient heat to cool high heat generating integrated circuit chips. The present invention further provides a heat sink unit or assembly which provides substantial surface area without substantially slowing or restricting the flow of coolant air across the surface of the heat sink unit or assembly.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. A thermally conductive unit comprising:
   a thermally conductive heat sink, said thermally conductive heat sink including:
      a first surface having a plurality of non-sinusoidal arc-shaped cooling fins formed therein, said non-sinusoidal arc-shaped cooling fins extending radially outward from a central region of said first surface to the periphery of said thermally conductive heat sink, said central region of said first surface comprised of a solid columnar core extending vertically from said first surface, said non-sinusoidal arc shaped cooling fins oriented so as to optimize heat transfer caused by a stream of coolant impinging and flowing by said non-sinusoidal arc-shaped cooling fins; and
   a second surface adapted to thermally contact a heat generating integrated circuit device such that heat generated by said heat generating integrated circuit device is dissipated by said non-sinusoidal arc-shaped cooling fins disposed on said first surface of said thermally conductive heat sink.

2. The thermally conductive unit of claim 1 wherein said solid columnar core extending vertically from said first surface is elliptically-shaped.

3. The thermally conductive unit of claim 1 wherein said thermally conductive unit further comprises:
   a fan coupled to said thermally conductive heat sink, said fan disposed such that said stream of coolant accelerated by said fan impinges said first surface including said non-sinusoidal arc-shaped cooling fins.

4. The thermally conductive unit of claim 3 wherein said thermally conductive heat sink has a recessed region formed into said first surface.

5. The thermally conductive unit of claim 4 wherein said fan is disposed within said recessed region.

6. The thermally conductive unit of claim 5 wherein said recessed region is formed into said first surface at said central region and peripherally surrounding said central region such that said recessed region extends into a portion of said non-sinusoidal arc-shaped cooling fins.

7. An embedded fan heat sink unit comprising:
   a thermally conductive heat sink, said thermally conductive heat sink including:
      a first surface having a plurality of non-sinusoidal arc-shaped cooling fins formed therein, said non-sinusoidal arc-shaped cooling fins extending radially outward from a central region of said first surface to the periphery of said thermally conductive heat sink, said central region of said first surface comprised of an elliptically-shaped solid columnar core extending vertically from said first surface, said non-sinusoidal arc shaped cooling fins oriented so as to optimize heat transfer caused by a stream of coolant impinging and flowing by said non-sinusoidal arc-shaped cooling fins; said first surface having a recessed region formed therein; and
      a second surface adapted to thermally contact a heat generating integrated circuit device such that heat generated by said heat generating integrated circuit device is dissipated by said non-sinusoidal arc-shaped cooling fins disposed on said first surface of said thermally conductive heat sink; and
   a fan coupled to said thermally conductive heat sink, said fan disposed within said recessed region such that said stream of coolant accelerated by said fan impinges said first surface including said non-sinusoidal arc-shaped cooling fins.

8. The embedded fan heat sink unit of claim 7 wherein said non-sinusoidal arc-shaped cooling fins are disposed such that optimal heat transfer is achieved by said stream of coolant impinging and flowing by said non-sinusoidal arc-shaped cooling fins.

9. The embedded fan heat sink unit of claim 7 wherein said recessed region is formed into said first surface at said central region and peripherally surrounding said central region such that said recessed region extends into a portion of said non-sinusoidal arc-shaped cooling fins.

* * * * *